United States Patent [19]

Lee

[11] Patent Number: 5,033,406

[45] Date of Patent: Jul. 23, 1991

[54] SIDE LIFTING TOOL WAFER-BOAT ASSEMBLY

[75] Inventor: Steven N. Lee, Irvine, Calif.

[73] Assignee: ASQ Boats, Inc., Tustin, Calif.

[21] Appl. No.: 340,487

[22] Filed: Apr. 19, 1989

Related U.S. Application Data

[63] Continuation-in-part of Ser. No. 66,032, Jun. 24, 1987, abandoned.

[51] Int. Cl.$^5$ ............................................. B05C 13/02
[52] U.S. Cl. ..................................... 118/500; 118/728; 211/41; 432/261
[58] Field of Search ................ 118/500, 728; 211/41; 432/261; 206/328, 454; 294/15

[56] References Cited

U.S. PATENT DOCUMENTS

| | | | |
|---|---|---|---|
| 4,355,974 | 10/1982 | Lee | 118/500 X |
| 4,439,146 | 3/1984 | Sugita | 118/500 X |
| 4,484,538 | 11/1984 | Sarkozy et al. | 118/728 X |
| 4,515,104 | 5/1985 | Lee | 211/41 X |
| 4,572,101 | 2/1986 | Lee | 206/328 X |
| 4,841,906 | 6/1989 | de Geest, Jr. | 118/500 |

Primary Examiner—Richard L. Chiesa

[57] ABSTRACT

A side lifting boat and a tool assembly is disclosed. The tool is detachably engageable to selectively lift a boat. Both boat and tool are anti-rotationally engageable by the tool's upper and lower projections at its forward end fitting into a correspondingly shaped space defined between the outer (non-wafer-carrying) surface on the side of the boat. The boat's corresponding space permits the lifting tool to be moved into the space and into position between two fulcrum points that stabilize the boat/tool assembly from anything other than a small relative angular rotation.

23 Claims, 3 Drawing Sheets

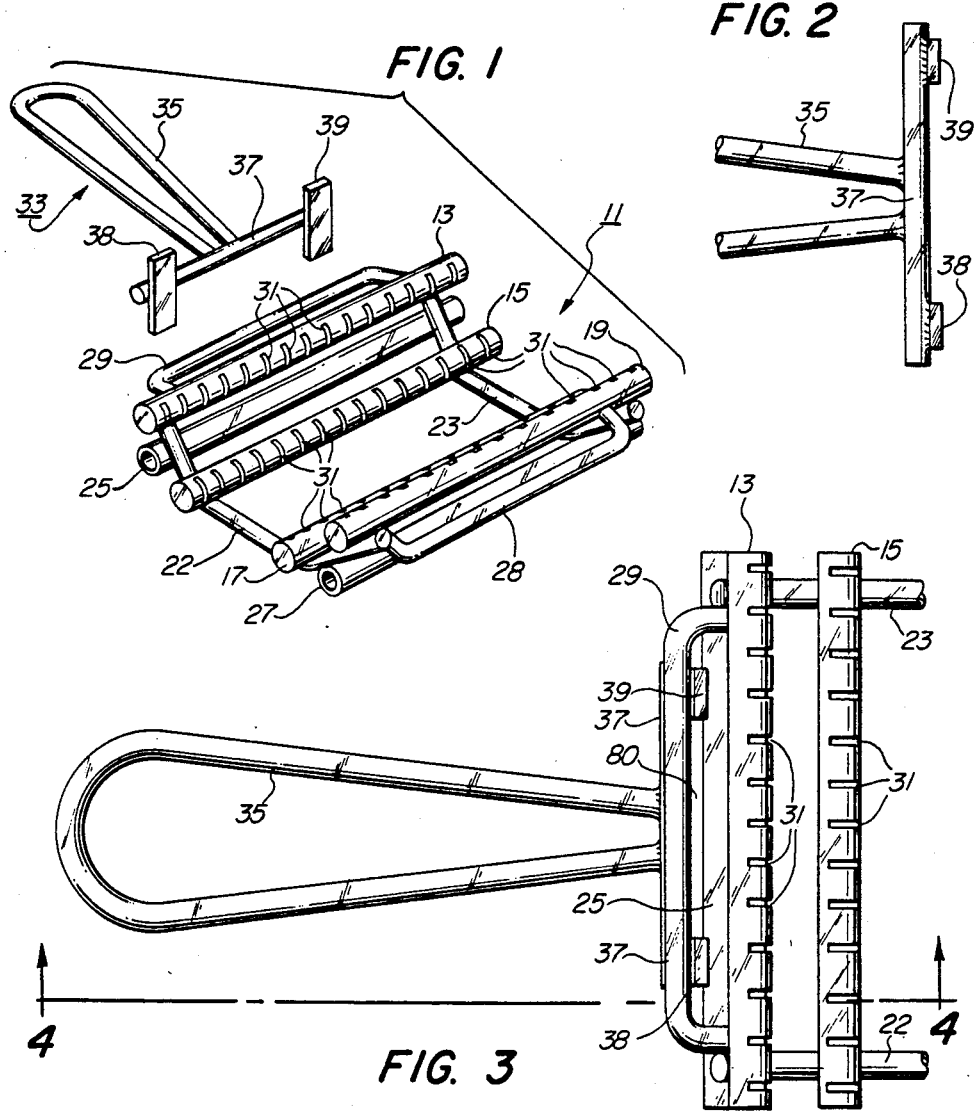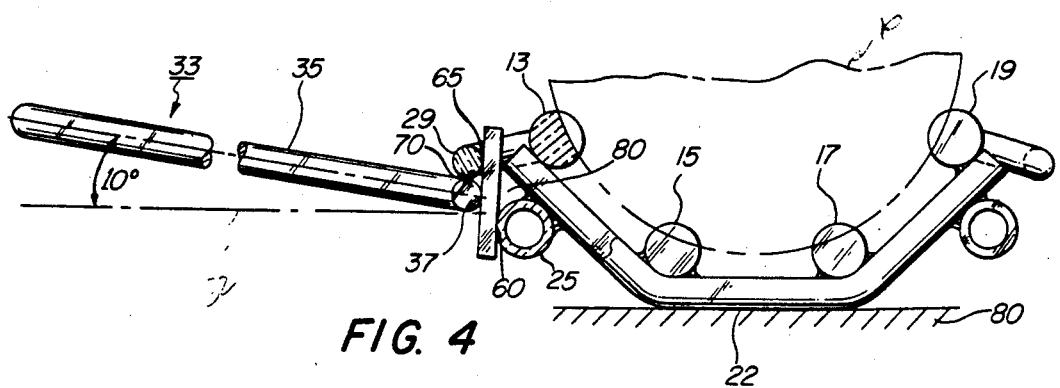

SIDE LIFTING TOOL WAFER-BOAT ASSEMBLY

ORIGIN OF THE INVENTION

The invention was conceived, made and assigned by a sole inventor to the assignee hereof. This Application is a continuation-in-part of an Application assigned to the common assignee hereof and invented by the inventor hereof, which application now abandoned, is entitled "IMPROVED SIDE LIFTING TOOL WAFER-BOAT ASSEMBLY" filed on June 24, 1987 and issued Ser. No. 07/066,032.

This application is a continuation-in-part of an Application assigned to the common assignee hereof and invented by the inventor hereof, which application now abandoned, is entitled "IMPROVED SIDE LIFTING TOOL WAFER-BOAT ASSEMBLY" filed on June 24, 1987 and issued Ser. NO. 07/066,032. The invention was conceived, made and assigned by a sole inventor to the assignee hereof.

FIELD OF THE INVENTION

This invention relates to carriers and lifting tools for the carriers. More particularly, the invention relates to a novel and unique design of a quartz boat and a lifting tool therefor.

BACKGROUND OF THE INVENTION

In my issued U.S. Pat. No. 4,572,101, an embodiment of a new and novel side-lifting tool for lifting wafer boats is disclosed. The side lifting tool of the '101 patent, in general, is adapted to engage a lifting rod or recess specially formed on the outside (i.e. non-wafer supporting) surface of the boat, so that the boat may be lifted prior to and after the supported wafers have received a high-temperature treatment which is disclosed in my '101 patent.

The figures in my '101 patent show that the side lifting tool has an essentially U-shaped handle, or lifting portion which terminates in a boat engaging portion that is adapted to engage exteriorly-located cross rods which are positioned on the side of a wafer boat, which boat is normally made of quartz glass and is termed a "quartz"boat. While the embodiment of my '101 patent has proven very useful and highly satisfactory, I have determined that a demand exists for a new and novel (a) side-lifting tool, (b) matching wafer boat, and (c) the combination thereof. My improved tool is durable and easy to use.

My newly-invented side lifting tool and matching boat is characterized by what is essentially a simple engaging/disengaging movement that may easily and readily be provided by a robotic end-effector system. In my earlier side lifting tool (of the '101 patent), a laterally and outwardly projecting portion of the tool had to be inserted at an angle approaching near vertical into a receiving location on the boat. Thereafter, a large relative rotational movement from vertical toward horizontal was required in order to couple the lifting tool to the boat.

My earlier tool was primarily intended for manual use, and the large rotational movement that was necessary to lockably engage boat to tool, and vice-versa, was easily supplied by an operator's hand and wrist. Such rotational movement under close and cramped conditions is not easily supplied. Additionally, a robotic system can readily provide the relatively limited rotational movements required for this invention.

The boats to be lifted are often located in cantilevered loading rods that are positioned at several elevations. Thus some loading rods are at waist level to a worker with additional higher and lower loading rods also positioned above and below that waist level loading station. Straight-handled lifting tools can easily reach and work with the waist-level loading locations, but do not work well for the high and/or lower loading locations. The present fulcrum and lifting part of the tool ( the "H" extensions) of the parent application is essentially mirror image in the upper and lower extensions from the point of attachment at the handle. Thus the tool can be turned over and used in either position equally as well for multi-level loading locations.

I have improved the tool further in this continuation-in-part application and make it more adaptable for use with boats positioned on multi-level loading locations by providing a deliberate bend (at an angle of about thirty degrees to the handle's axis) in the tool's handle.

Applicant calls the prior art in the '101 Patent to the attention of the Patent Office, but notes that such prior art is not as relevant as the '101 Patent itself.

The side lifting tool of this invention is characterized by a tool and matching boat which are especially adapted primarily for horizontal and limited vertical to horizontal ("angular") rotational movement in order to secure the tool to the boat for lifting purposes. The improved tool has an angled bend in the handle to improve its use and efficiency. In either the straight or angled-handled tools the engaging and lifting portions of the tool are essentially mirror images of each other relative to the point of attachment to the handle. This shape provides proper tool engagement and lifting whether it is right side up or turned over.

SUMMARY OF THE INVENTION

In accordance with the invention, a side lifting boat and a tool assembly is provided. The tool is detachably engageable to selectively lift a boat. Both boat and tool are engageable by the tool's horizontal movement into a vertical open space defined between the outer surface of a lower fulcrum bearing point on the side of the boat, and an upper slot's inner fulcrum bearing point also located on the same side of the boat. That fulcrum space permits the lifting tool to be moved vertically or near vertically ("vertically") into the fulcrum defining space. A small relative rotation of the tool's extensions and the boats' side forms an anti-rotational and stabilized locking position between the two fulcrum points. Essentially a limited two degree-of-freedom movement is all that is required to securely position the upper and lower extensions (located at the forward end of the tool) into position for anti-rotational contact with the two fulcrum points.

Stated more particularly, a horizontal insertion of the lifting tool is required in a forward direction until a lower projection of an essential "H" shaped engagement portion of the tool touches, or nearly touches, the lower fulcrum point. Then the tool is moved "vertically" until the tool's rearwardly-facing upper ear of the "H" shape is in position to bear against an upper and inner fulcrum support formed on the outer surface of the boat by a spaced horizontal member. The amount of rotation of tool and/or boat is in the order of 10 degrees or less for a straight-handled tool. This limited rotation may readily be provided in tightly confining spaces or by robotic type end effectors.

The ears of the "H" shape are rigid and are securely fastened or otherwise formed on forward section of the handle portion of the tool. Such ears in one form are flat projections extending laterally above, below and perpendicular to the axis of the tool's handle. In another embodiment, the upper and lower ears are formed as a rigid concave shape relative to the end of the tool to which the ears are formed or attached. Two inner and upper surfaces of the tool's "H" portion and two outer and lower surfaces of the "H" portion touch the boat at fulcrum points. Additional points on the boat define a weight supporting and lifting surface while the fulcrum points impede rotation of the boat so that the boat is stabilized during lifting. The term anti-rotational is used to define the manner in which the relative rotation of the boat and the tool's "ears" co-operate to stabilize and lift a boat.

In one described embodiment, lifting engagement is accomplished by providing an assembly wherein the tool and boat are brought to bear against each other by at least a pair of upper and a pair of lower fulcrum contact points.

The boat in another embodiment is provided with first and second horizontal, upper and lower rod members centrally located and extending a substantial distance along the length of the boat. An upper horizontal rod is located slightly below the middle of a plurality of edgewise wafers when stowed in the boat while the lower rod is located nearer toward the bottom of those edgewise wafers. From an end view of the boat these two rods are not in the same vertical plane and thus are offset from each other by a small distance. The two rods establish between their length, due to their offset, a vertical fulcrum space in the shape of a thin vertical plane, which plane is slightly inclined toward the wafers when viewed from an end location of the boat.

A U-shaped handle of the lifting tool is attached to a boat engaging member located at the forward end of the U-shaped handle. A pair of attachment points at the open end of the U-shaped handle are adapted to bear against at least one of the boat's horizontal members in order to form both an anti-rotation (wedging) means and a lifting point contact at that horizontal rod. The tool may also include a second horizontal boat engaging member, which member is located between the point of attachment of the handle and the boat engaging extension. This second member is adapted to bear for lifting against the side of the boat.

It will be readily appreciated that the boat must provide a pair of opposed and offset contact ("fulcrum") points which lie on opposite sides of the tool's longitudinal axis in order to define an anti-rotational stabilizing and lifting combination between the tool's ears and the boat's side. My '101 patent does not teach or suggest such an opposed and opposite relationship between the tool and the boat side nor does it achieve the anti-rotation and lifting function in a simple and inexpensive combination as is herein disclosed.

The assembly is adapted to engage the boat and lifting tool without the necessity of fork receiving tubes or other connecting members disposed along the ends of the boat as is known in some of the prior art. These connecting members at the ends of the boats create a bothersome discontinuity and prevent the boats from being designed for contiguous end-to-end positioning. Accordingly, side lifting may be effected by this invention in boats that are located contiguously in end-to-end fashion without introducing wafer gaps between adjacent boats holding the wafers to be processed. Uniform spacing may therefore be accomplished by the boats of this invention so that there are no gaps in the spaces between all wafers of several contiguous boats as taught and claimed in my '101 and my U.S. Pat. No. 4,515,104 ('104).

BRIEF DESCRIPTION OF THE DRAWINGS

FIG. 1 is a perspective view of one embodiment of the boat and tool assembly;

FIG. 2 is a top view of a portion of the tool assembly illustrated in FIG. 1;

FIG. 3 is a top elevational view of the structure illustrated in FIG. 1 showing the tool in engagement with a side- lift rod on a boat;

FIG. 4 is an end view taken along the lines 4—4 as shown in FIG. 3;

DETAILED DESCRIPTION OF THE PREFERRED EMBODIMENT

Figure 5:
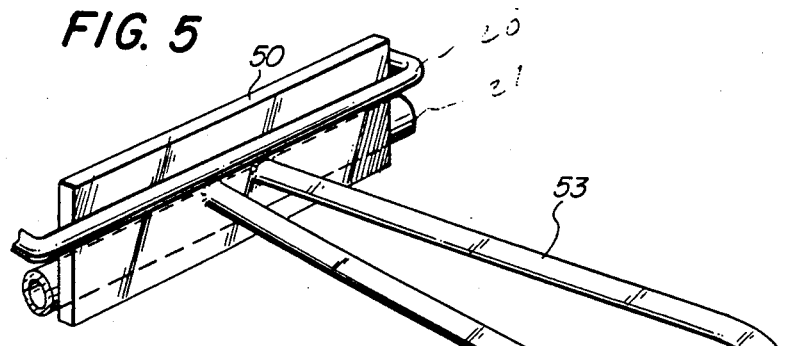
FIG. 5 is a perspective view of an alternative embodiment of the tool.

Referring first to FIG. 1, the boat 11 shown therein includes a plurality of horizontal members, or side rails 13, 15, 17 and 19 disposed along the length of boat 11. The horizontal members are attached to cross members, or braces, 22 and 23 which define a structure having generally a V-shaped cross section. Slots 31 are located on the inner surfaces of the members 13, 15, 17, and 19 in order to define a cradle for holding spaced edgewise wafers such as 10 shown in dashed lines in FIG. 4. Either vertical or angled slots 31 may be provided for the boats, of this invention.

The horizontal members 13, 15, 17 and 19 are disposed on the inside of cross members 22 and 23, and each rod includes a plurality of spaced slots 31 extending along the length of the horizontal members. Slots 31 are adapted to receive and support wafer disks during fabrication in a high temperature furnace. Slots 31 may be formed with different shapes, such as U-shaped, Y-shaped or V-shaped grooves to accommodate the particular application. Also, as further described in the previously issued U.S. Pat. No. 4,355,974 for "Wafer Boat," assigned to the common assignee, the slots along the length of boat 11 may be cut at an angle so as to support each wafer at a slight angle with respect to vertical The angles reduce the play of the wafer within the groove and increase uniformity of wafer processing.

As shown in FIGS. 1, 3 and 4, boat 11 may be provided with horizontal tube members 25 and 27, disposed on the lower outside of cross members 21 and 23 and connected thereto. Tube members 25 and 27 may be hollowed out at the ends and sized to receive a fork shaped member that may be used for front or rear lifting of boat 11. Alternatively, tubes 25 and 27 may be replaced by horizontal solid rod members that will accommodate side lifting tools, such as tool 33 (Figure only, but will not accommodate a fork shaped front lifting tool such as that described and depicted in my '104 patent.

Positioned on the upper side of boat 11 are another pair of horizontal members 28, 29. Members 28, 29, being bent transversely at their ends, form a lifting space by suitable connection of the transversely bent portions to upper horizontal members 13, 19 on opposite sides of boat 11. Members 25, 29 and 27, 28 are spaced from one another in different horizontal and vertical planes (herein defined as "offset") so as to define vertical lifting and fulcrum openings which run horizontally across a centrally-located section of both sides of the boat 11. Each opening, such as opening 80, shown in the end view of boat 11 in FIG. 4 defines an anti-rotational and lifting space adapted to receive the forward extensions of the boat-engaging portions 38, 39 of the tool 33. When stabilized in that space the tool and boat lift together as one for an improved side lifting tool and boat combination.

Tool 33 is adapted for side lifting of boat 11. Use of a side lift tool 33 allows the slots 31 in the wafer boats to be spaced uniformly from wafer to wafer whenever two boats such as boat 11 and another similar boat are position contiguously with one another. Furthermore, at the front end of one boat, the last slot is spaced, from the ends of the horizontal members, a distance of one-half of the wafer's spacing. This means that when several boats are spaced front end to back end contiguously in a row, the spacing between all wafers is uniform. Side lifting allows such contiguous boat positioning with uniform wafer spacing in each boat and from boat to boat. The advantages associated with these features are described in more detail in my '104 patent.

Tool 33 includes handle portion 35 which is connected to horizontal member 37. A pair of straight ear members 38, 39 are transversely oriented near the ends of the horizontal member 37. As mentioned earlier, the boats and lifting tools are often constructed from high temperature quartz glass. In the invention the tool 33 and the boat 11 may both be constructed from quartz tubing/rods that is heated during construction and the heated ends of the material is fused to the other sections to complete the constructions substantially as shown in the Figures. Additional material that may be used includes materials such as silicon carbide, metal ceramic and the like. Such construction is very well known in this art and needs no further description.

Ear members 38, 39 are fused to members 35 and 37 to form a side lift tool. In use, ears 38 and 39 are inserted into the lifting and fulcrum space (actually as described later they are wedged slightly, or stabilized against rotation, into a lifting position) such as space 80, FIG. 4, formed in boat 11 by members 25, 29 or 27, 28, respectively, on opposite sides of the boat 11. Ears 38, 39 are typically spaced approximately 2 to 20 inches apart depending upon the side length of the wafer boat 11. The upper rearward facing ears and the lower forward facing extensions that define the ear members 38, 39 engage along the outside of lower horizontal tube member 25 of boat 11 to form a pair of lower fulcrum points. One such lower fulcrum, or anti-rotation, contact point 60 is shown in the end view of the boat 11 as depicted in FIG. 4.

The rearward-facing parts of the extensions that define the upper portions of ear members 38, 39 bear against the inner surface of horizontal member 29 to form another pair of fulcrum, or anti-rotation, contact points on the inside of the upper horizontal member 29. FIG. 4 depicts one such upper fulcrum point 65 in the end view of boat 11 as shown therein. The upper length of horizontal tool member 37 bears against the lower portion of horizontal member 29 after the ears 38, 39 are wedged slightly in fulcrum space 80, in order to form a lifting and stabilizing surface in a line contact between the two members 37 and 29. That relationship of member 37 and horizontal member 29 is clearly shown at 70 in the end view of boat 11 and tool 33 in FIG. 4.

The lift and fulcrum, or anti-rotational, points formed between members 37, 29 and 25 includes a full length lifting surface (shown in FIG. 4, simply as point 70) between members 37 and 29 and the upper and lower pairs of fulcrum points, such as points 60 and 65 which are also depicted in FIG. 4. The line contact between the two members 37 and 29 in the end view of FIG. 4, is shown by the mid-point of the "x" at 70. By virtue of the described contact, the boat 11 becomes firmly engageable for lifting by tool 33, and lifting may be from the lower side of either horizontal member 29 on the left side of boat 11, FIG. 4 or on the lower surface of member 28 from the right side of the boat 11, as shown in FIG. 4.

In the presently preferred embodiment, tool handle 35 forms a slight upward angle, of approximately 10 degrees, from horizontal (horizontal is shown by dashed line 32) when member 37 of tool 33 is in lifting engagement to boat 11 i.e., when boat 11 is also resting on another horizontal supporting surface. Upon lifting, handle 35 maintains it's "essentially horizontal" position. Only slight relative rotation between boat 11 and tool 33 (less than about 5 to 10 degrees) is required to firmly secure the lifting and fulcrum points as required for the side lifting combination of boat tool of this invention. That relative rotation will cause the upper line surface of horizontal member 37 to touchingly bear against the lower surface of member 29 in order to stabilize the tool 33 and boat 11 during the lifting engagement of the two.

It should be noted that insertion of tool 33 is done in essentially a horizontal plane, say at 5 degrees above horizontal 32, with the projection of the top of ears 38, 39 being positioned slightly below the lower surface of upper member 29. When the outside surface of the lower ears 38, 39 barely touch the outer surface of lower member 25, a vertical or inclined upward, movement is imparted to the then substantially horizontal tool 33.

A lifting surface may be formed by the lower side of horizontal member 29 raised into touching contact with the lower surface of upper horizontal rod 37 connected between handle 35 and ears 38,39. FIG. 3 depicts a top sectional view looking down from above unto tool 33 which is depicted slightly wedged in lifting engagement with boat 11. A vertical fulcrum and lifting space 80, which is adapted to initially receive the tool 33 between upper member 29 and lower member 25 is also clearly shown in this view of FIG. 3 when compared with end view shown in FIG. 4. The fulcrum, or anti-rotational, lifting space 80 is defined in this invention as being a vertical plane that is slightly inclined toward the wafer-containing portion of boat 11. That slightly inclined plane of space 80 will be understood by reviewing the top and end views thereof respectively in FIGS. 3 and 4.

FIG. 5 does not rely upon two ear pairs 38, 39 and a separate horizontal member 37 as depicted in FIGS. 1 through 4. Instead, a straight solid planar elongated thin bar member 50 is chosen with a width and length to substantially fill and wedgingly fit within the fulcrum space 80, FIG. 3, when the lifting tool of FIG. 5 is being used. Once bar 50 has been inserted in place in space 80, FIG. 3, wedging, or anti-rotational, action occurs between the inside surface of horizontal upper member 29, the outer surface of member 25, and corresponding surfaces on bar 50. Such anti-rotational action is clearly depicted in FIGS. 1 through 3 and it is only implied by the partial structure given in FIG. 5. The handle 53 is contacted at the lower part of 28 at points 28a and 28b. These points need only be spaced far enough apart so that boat is stabilized from length-wise rocking when lifted.

The looped open end of a U-shaped handle 53 at the point of fusing to bar member 50 includes a pair of spaced-apart connection points which bear underneath the upper horizontal member 28, FIG. 5, with enough distance separating the connection points that a lifting and stabilizing surface with the lower surface of upper horizontal rod member 29 is achieved. It should be understood that the offset and opposite contacts of FIG. 5 between 50 and 27,28 form an anti-rotational and a lifting combination in a simple and straightforward manner.

Figure 6:
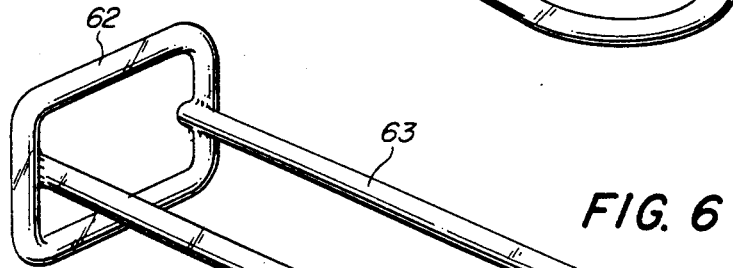
FIG. 6 is a perspective view of an alternative embodiment of the tool's construction.

FIG. 6 depicts an alternate construction of a tool which employs an open rectangular loop 62 formed from circular stock such as a quartz rod. Other equally suitable materials include ceramic, silicon carbide, polysilicon and the like. The open rectangular loop 62 and its fused connection to handle 63 employs a wedging and lifting action in the manner previously described herein.

Figure 7:
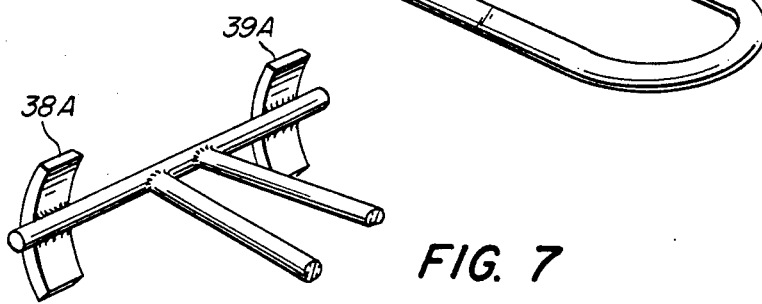
FIG. 7 is a perspective view of another version of the tool.

FIG. 7 depicts curved ears 38A and 39A rather than the straight ears 38, 39 of FIG. 1. In FIG. 7 the curved ears 38A, 39A are formed as slightly convex surfaces relative to the side of boat 11 in order to more readily engage relatively narrow space 80, FIG. 3, while still providing the lifting and fulcrum anti-rotational wedging principles of this boat/tool invention.

Figure 8:
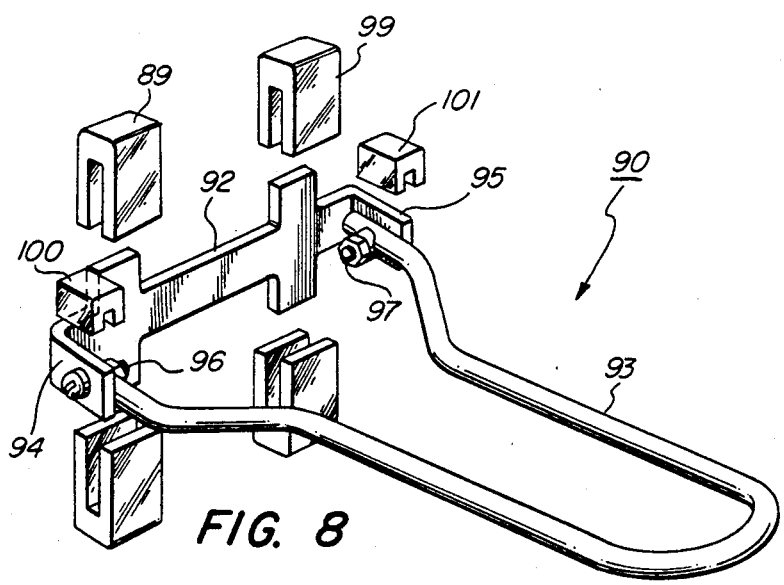
FIG. 8 is a perspective view of an alternative construction of the tool.
Figure 9:
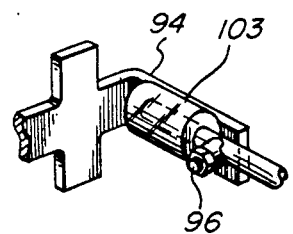
FIG. 9 is a portion of FIG. 8 used to depict an alternative configuration for the invention.

FIGS. 8 and 9 show another alternative embodiment 90 of a lifting tool 90 for boat 11. Tool 90 is constructed in accordance with the principles of my invention and includes a lifting portion 92 made of any suitable solid material such as metal. The bent back extensions 94, 95 of lifting portion 92 are fastened by any suitable means such as screw and nut fasteners 96, 97 to handle 93. The angle between handle 93 and ears 92 need not be a right angle but can readily be adjusted through the screws and nuts fasteners. Metal 92 and the bent back extensions 94, 95 may be encapsulated with covers 89, 99, 100, 101 or 103 selected from quartz, ceramic silicon carbide, polysilicon or similar type material to assure cleanliness in operation.

In FIG. 8, the screw and nut combinations 96,97 may be used to adjust the side lifting tool at different angles if such adjustments are required for any given application of the invention. Such adjustments are particularly useful when the system is controlled in a robotic environment for the tool and boat invention presented in this application.

In one alternative embodiment the lower member 25 may be fused to the lower ear sections of the tool, rather than to the boat. When in use, as a fused part of the tool, member 25 will bear against the cross pieces 22, 23 on the side of boat 11.

Figure 10:
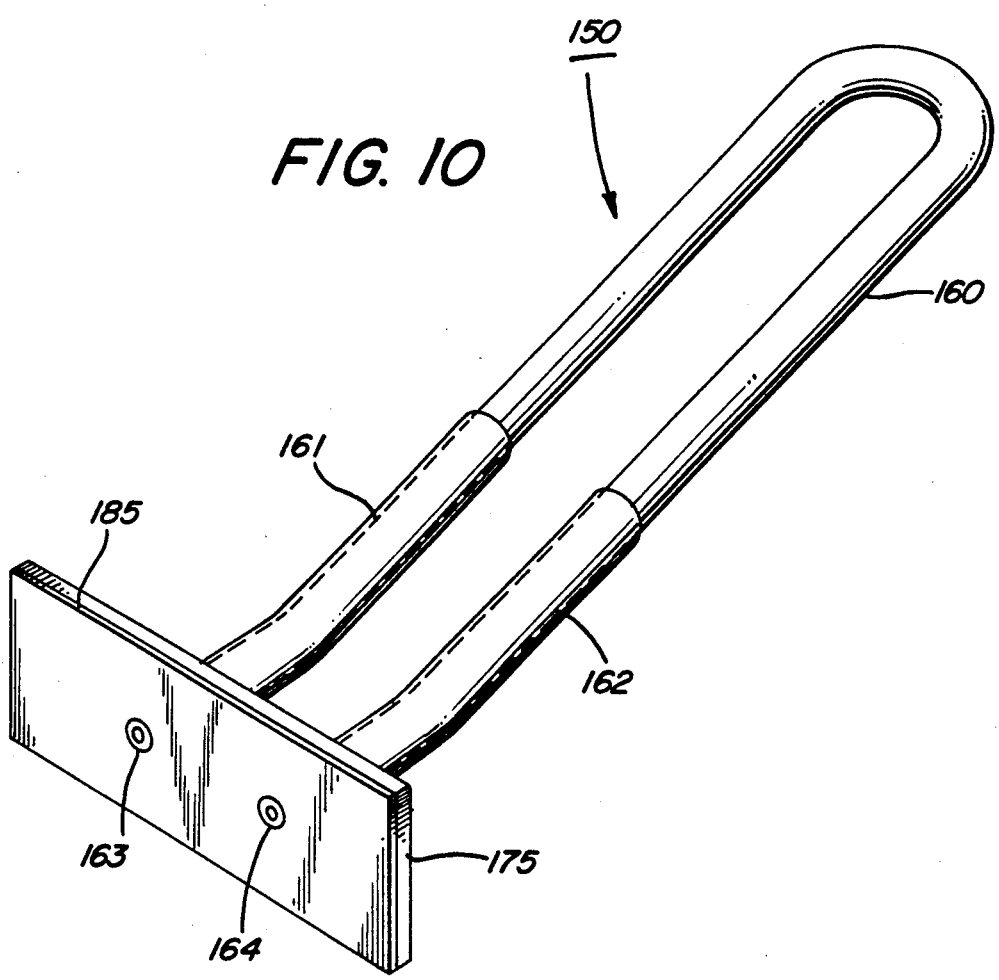
FIG. 10 is a top perspective view showing an alternate embodiment of the tool invention hereof.

In FIG. 10 another embodiment of the tool 150 is presented. Tool 150 again includes a U-shaped handle 160 which may be formed from any suitable material such an stainless steel. The normally open ends of the U of handle 160 are encased within any suitable sleeves 161, 162 selected from a suitable material such as those discussed above in connection with FIGS. 8 and 9. Additionally I have discovered that the encasement of the handle 160 by sleeves 161, 162 at the location where the handle comes into lifting and anti-rotational engagement with the upper and lower horizontal rods such as rods 27,28 (FIG. 5) provides additional benefits to the overall processing of wafers.

One of the most serious sources of contamination during wafer processing can be traced to very fine particles of glass or metal that develop as the equipment is moved and/or contacted during the processing sequence. For example the contact of glass to glass or metal to glass as can be expected by side lifting of boat 11 by a tool such as tools 33 or 90 of this invention (unless protective coatings such as those taught in my FIGS. 8, 9 are employed) is a source of potential trouble. Such particles if inserted into the high-temperature furnaces will potentially destroy the purity of all wafers being processed in that furnace.

Very minute particles of glass and metal are formed by the contact of the uncoated tool and boat. These minute particles during the wafer processing become giant boulder-like contaminants to the very small and delicate circuitry that is present on the wafers being processed. The end result of the glass to glass or metal to glass contact is that the resulting contaminants reduce the yield and lead to increases in wafer processing costs. Note that the covers for the contact surfaces of the tool 90 shown in FIG. 8 greatly reduce or totally eliminate this potential problem, and the invention features this key benefit. However the covers 89, 99, 100 and 101 and the tool's "ear" configuration for tool 90 are costly and thus the tool there presented is not entirely satisfactory.

I have greatly simplified the tool as shown in FIG. 10 and it provides a soft contact and the anti-rotational rotation fulcrum and lifting principles of my invention in a new and simplified manner. The tool of FIG. 10, in accordance with my invention, is constructed of a new and improved material. I have discovered that the use of a material such as Ultem from General Electric or VESPEL from Dupont either of which is a high temperature material that will withstand the exceedingly high heat of wafer furnaces provides a simple and effective tool construction. VESPEL and/or ULTEM are shaped into flat thin bars such as bar 175 that may be simply fastened to the U-shaped handle 160 by screws 163,164 or brads or any other acceptable fastening means. The screws should be coated, or recessed, so that they do not cause any metal to quartz boat contact during lifting of a boat such as boat 11.

The forward facing ULTEM material comprising bar 175 is also TEFLON coated at the forward surface; and thus tool 150 is characterized by sufficient lifting strength yet it presents a soft contact that is not subject to chipping, breaking or to particle formation. While other types of material may also be used I have found an advantageous increase in yield when the tool for side lifting is made in accordance with this invention. The handle may also be made of ULTEM or VESPEL material, or it may be TEFLON coated tubing sleeves inserted over stainless steel, for example. Other approaches of my invention may use quartz sleeves or collars or any other suitable covering.

Figure 11:
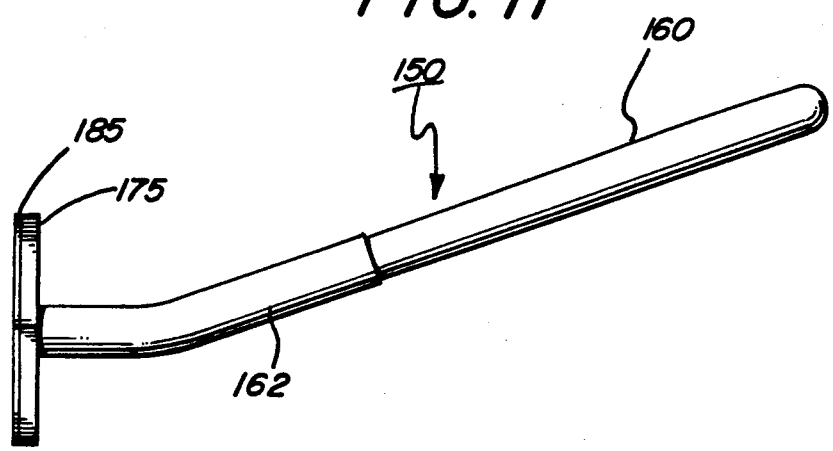
FIG. 11 is a side view of the tool shown in FIG. 10.

Tool 150 is provided with an angled bend in the handle 160 of about 30 degrees as shown in FIG. 11. The angled bend and the symmetrical upper and lower ear-like extensions for the front bar 175 achieve a versatility of the tool that is highly advantageous. Often the furnaces used for wafer processing are at multi-level loading positions including high, middle and lower furnaces. The angled bend in handle 160 allows the handle to be rotated through 180 degrees so that the lifting engagement with boats 11 at upper and/or lower furnace tiers can easily be accommodated.

Again the symmetrical upper and lower extensions of the forward part of the tool, in combination with a lifting plane on the boat's side which has offset and opposite contact points, provides anti-rotational lifting. Added versatility is provided by turning the angled handle either up or down depending upon the tier location of the boat to be moved. An angled handle allows the tool's forward extensions to be moved into the fulcrum and anti-rotational lifting space of boat 11, in the manner described for the invention, when boats are in a tiered furnace application. In summary, a new and novel tool/boat assembly operating in a manner that is not taught or suggested by the prior art is fulfilled.

The above description presents the best mode contemplated in carrying out my invention. My invention is, however, susceptible to modifications and alternate constructions from the embodiments shown in the drawings and described above. Consequently, it is not the intention to limit the invention to the particular embodiments disclosed. On the contrary, the invention is intended and shall cover all modifications, sizes and alternate constructions falling within the spirit and scope of the invention, as expressed in the appended claims when read in light of the description and drawings.

I claim:

1. A side lifting wafer boat-tool assembly positioned for detachable, mutual engagement along a central length of the side of a boat, which boat is shaped to receive on its inside a plurality of wafer disks, with said tool lifting the boat by its side from a boat supporting surface, said assembly comprising:
   a first horizontal boat member with an inner surface being spaced from and extending along the outer side of said boat at a centrally-located lower boat location thereon, with said first and second boat members being in separate horizontal planes and lying also in two different vertical planes when viewed from an end view of said boat in order to define a vertical anti-rotation/lifting plane which is located between the inner and outer surface of the first and second boat members,
   said boat members in offset relationship to each other in said two different vertical planes; and
   a tool having an elongated handle with a longitudinal axis which is to be inserted between said offset members, and comprising at the forward end of said handle an essentially transversely-oriented boat-engaging member connected thereto for insertion by slight relative angular rotation between the boat and the handle, said tool anti-rotationally stabilized for side lifting the boat from its supporting surface by said tool's transversely-oriented member coming into contact with said inner and outer surfaces of said first and second offset boat members.

2. The assembly as recited in claim 1 wherein said first horizontal boat member;
   includes a straight centrally-located section connected to the side of said boat in order to define a space between the inner surface of said first horizontal member and the side of the boat; and
   said space lies in said boat-lifting plane and is essentially filled by the anti-rotational action of said boat-engaging portion of said side lifting tool.

3. The assembly as recited in claim 1 wherein said second horizontal boat members is a hollow tube at the end, and;
   said hollow end and another member with another hollow end is located on opposite sides of said boat in order to also receive, for an alternate lifting action;
   a front lifting insertion tool that is sized to fit within said hollow ends on opposite sides of said boat.

4. The assembly as recited in claim 1, wherein said tool further includes;
   a boat-supporting member to stabilize said boat for lifting by said tool, and;
   said tool's boat-supporting member contacts the first horizontal boat member thereby facilitating engagement of said transversely-oriented boat-engaging member of said tool with said first horizontal boat member.

5. The assembly as recited in claim 1, wherein the transversly-oriented boat-engaging portion of the tool, with the boat's horizontal member, forms;
   anti-rotational contact points which are disposed and spaced toward the boat ends along the side of said boat.

6. The assembly as recited in claim 1, wherein said tool further comprises;
   a rod transversely connected to said handle and disposed generally parallel to the first horizontal boat member at the side of said boat, when said tool is positioned for side lifting said boat by said tool.

7. The assembly as recited in claim 6, wherein said tool further comprises;
   a generally H-shaped forward portion thereof, said H-shaped portion including ears connected to said rod at spaced locations along the forward length of said transverse rod and extending generally vertically therefrom, and
   said ears having upper and lower end portions each being engageable with said first and second boat members to form lifting fulcrum points between said tool and said boat.

8. The assembly as recited in claim 1, and further wherein:
   the inside of said boat is formed with slots adapted to receive said wafer disks.

9. The assembly recited in claim 8, wherein said wafer-receiving slots are uniformly spaced and extend along the length of the inside of said boat, and said boats being arranged such that;
   a plurality of boats may be disposed lengthwise and contiguously, with the space between proximate slots on adjacent boats being equal to the space between adjacent slots in each individual boat.

10. The assembly as recited in claim 1, and further wherein:
    said boat engaging member rotates slightly from an essentially horizontal position, as the tool is moved into position with the boat, and then vertically into an anti-rotational and stabilized lifting engagement with the boat.

11. A hookless tool for lifting wafer boats, with the boat having, along one side thereof, a centrally-located space shielded from the wafer carrying portion of the boat, said tool comprising:

an elongated handle having a longitudinal axis;

a boat-engaging portion located at the forward end of said handle, and essentially transversely oriented to said handle, and essentially transversely oriented to said handle's longitudinal axis;

means on the boat-engaging portion for anti-rotationally wedging within said space on said boat, in such a manner that the side of the boat and the tool contact each other at a pair of contact points with one each of said pair of contact points located on opposed and opposite sides, above and below, said longitudinal axis of said tool's handle; and means on said tool bearing against an outside surface of said boat between said contact points to form a hookless lifting surface between said tool and said boat.

12. A combination tool and boat in accordance with claim 11 wherein said space on said boat is defined, in part, by a: horizontal member connected to the upper outside surface of said boat for defining a vertical opening running horizontally along the central side of the wafer boat and having within said opening said pair of contact points.

13. A combination in accordance with claim 12 and further wherein said boat-engaging portion of said tool comprises:

said upper and lower projections forming two pair of ears spaced apart by a length approaching but shorter than the length of the space at said side of said wafer boat.

14. A combination in accordance with claim 12 wherein said tool further comprises:

said boat-engaging portion including at least one pair of upstanding projections located above and below said tool's longitudinal axis.

15. A combination in accordance with claim 14 wherein said tool further comprises:

the upper projection's rearmost surface and the lower projection's foremost surface forms said anti-rotationally lifting means.

16. A combination in accordance with claim 14 and further wherein said tool comprises:

said lifting surface engaging means comprises a rigid member connecting the pair of spaced-apart ears together and to said elongated handle.

17. A combination in accordance with claim 11 wherein said tool further comprises:

said boat-engaging portion is a flat planar elongated bar member projecting above and below said handle's longitudinal axis with the bar member's opposed surfaces forming said anti-rotational means.

18. A combination in accordance with claim 11 and comprises:

said elongated handle of said tool being essentially U-shaped, and adapted at the otherwise open ends of said U-shape, with fastening means for coupling said handle to said boat engaging member.

19. A combination in accordance with claim 11 wherein:

said elongated handle has a straight longitudinal axis.

20. A combination in accordance with claim 11 wherein:

said tool's boat-engaging portion is comprised of non-quartz ceramic high temperature resistant material, and said boat-engaging portion is connected by covered, or recessed, fastening means to an elongated straight, or angled, handle.

21. A combination in accordance with claim 11 wherein:

said handle is comprised of quartz material, said boat engaging portion is comprised of metal and further comprises a quartz material encapsulating said metal portions of said boat engaging member at least at locations which come into contact with said wafer boat.

22. A combination in accordance with claim 21 wherein:

said quartz handle is essentially U-shaped and is made from a quartz rod; and said boat engaging portion is a flat quartz member fused to said handle.

23. A side lifting wafer boat positioned to be lifted from one side at a time by a hookless tool assembly for detachable, mutual engagement along the one side of said boat to lift the boat by said side from a boat supporting surface, the tool having a handle with a longitudinal axis and at its forward end a transverse member projecting above and below said handle as a boat engaging member positioned to be, by slight relative angular rotation wedged between the boat and the tool's boat-engaging portion, and anti-rotationally stabilized for lifting against the outside side surface of said boat, said boat comprising:

an inside surface slotted so as to receive a plurality of wafer disks, disposed in spaced parallel relation inside said boat;

a first boat member spaced away from the outside surface on the side of said boat, and said member extending along said side of said boat at an upper location thereon; and said boat member defining an essentially vertically oriented space to receive and contact said tool's transverse boat-engaging member at upper and lower points on opposite sides of said handle's longitudinal axis that anti-rotationally wedge into said space and stabilize said boat for a side lift by said tool.

* * * * *